United States Patent
Ang et al.

(10) Patent No.: US 9,678,363 B2
(45) Date of Patent: Jun. 13, 2017

(54) OPTICAL ARTICLE WITH GRADIENT PHOTOCHROMISM

(71) Applicant: ESSILOR INTERNATIONAL (COMPAGNIE GENERALE D'OPTIQUE), Charenton-le-Pont (FR)

(72) Inventors: Ker Chin Dave Ang, Singapore (SG); Andrew Pelayo, Singapore (SG); Francisco De Ayguavives, Charenton-le-Pont (FR)

(73) Assignee: ESSILOR INTERNATIONAL (COMPAGNIE GENERALE D'OPTIQUE), Charenton-le-Pont (FR)

( * ) Notice: Subject to any disclaimer, the term of this patent is extended or adjusted under 35 U.S.C. 154(b) by 0 days.

(21) Appl. No.: 15/023,086

(22) PCT Filed: Sep. 19, 2014

(86) PCT No.: PCT/EP2014/070040
§ 371 (c)(1),
(2) Date: Mar. 18, 2016

(87) PCT Pub. No.: WO2015/040184
PCT Pub. Date: Mar. 26, 2015

(65) Prior Publication Data
US 2016/0231594 A1 Aug. 11, 2016

(30) Foreign Application Priority Data
Sep. 20, 2013 (EP) .................................. 13306288

(51) Int. Cl.
| | |
|---|---|
| *G02C 7/10* | (2006.01) |
| *G02B 1/11* | (2015.01) |
| *G02B 1/115* | (2015.01) |
| *G02B 5/28* | (2006.01) |
| *C23C 14/24* | (2006.01) |
| *G02B 1/111* | (2015.01) |

(52) U.S. Cl.
CPC .............. *G02C 7/102* (2013.01); *C23C 14/24* (2013.01); *G02B 1/11* (2013.01); *G02B 1/111* (2013.01);
(Continued)

(58) Field of Classification Search
CPC .......... G02B 5/28; G02C 7/102; G02C 7/105; G02C 7/107; G02C 7/02
(Continued)

(56) References Cited

U.S. PATENT DOCUMENTS

| | | | |
|---|---|---|---|
| 3,442,572 A | 5/1969 | Illseley et al. | 359/578 |
| 4,289,497 A | 9/1981 | Hovey | 8/506 |

(Continued)

FOREIGN PATENT DOCUMENTS

GB    1520099    8/1978

OTHER PUBLICATIONS

International Search Report and Written Opinion issued in PCT/EP2014/070040, mailed on Nov. 19, 2014.

*Primary Examiner* — Darryl J Collins
(74) *Attorney, Agent, or Firm* — Norton Rose Fulbright US LLP

(57) ABSTRACT

The present invention is drawn to an optical article comprising: (a) a photochromic substrate comprising at least one photochromic dye, and (b) an interference coating having a specific gradient thickness providing for a gradient reflectance. It also pertains to a process for making such an optical article.

9 Claims, 1 Drawing Sheet

(52) U.S. Cl.
CPC ............... *G02B 1/115* (2013.01); *G02B 5/28* (2013.01); *G02C 7/105* (2013.01); *G02C 7/107* (2013.01)

(58) Field of Classification Search
USPC ..................... 359/241–244, 586, 587, 722; 351/159.03, 159.39, 159.4, 159.61, 351/159.73
See application file for complete search history.

(56) References Cited

U.S. PATENT DOCUMENTS

| | | | |
|---|---|---|---|
| 5,009,486 A * | 4/1991 | Dobrowolski | G02B 1/10 283/91 |
| 5,574,517 A * | 11/1996 | Pang | G02C 7/105 351/44 |
| 6,175,450 B1 | 1/2001 | Andreani et al. | 359/586 |
| 6,674,587 B2 | 1/2004 | Chhabra et al. | 359/888 |
| 7,633,681 B2 | 12/2009 | Marusi et al. | 359/587 |
| 2004/0240067 A1 | 12/2004 | Marusi et al. | 359/588 |
| 2004/0257525 A1* | 12/2004 | Moravec | G02C 7/12 351/159.62 |
| 2005/0078375 A1 | 4/2005 | Hall et al. | 359/581 |
| 2008/0187760 A1 | 8/2008 | Wiand | 428/412 |
| 2012/0218512 A1 | 8/2012 | Archambeau et al. | 351/159.61 |
| 2014/0233105 A1* | 8/2014 | Schmeder | G01J 3/465 359/590 |

* cited by examiner

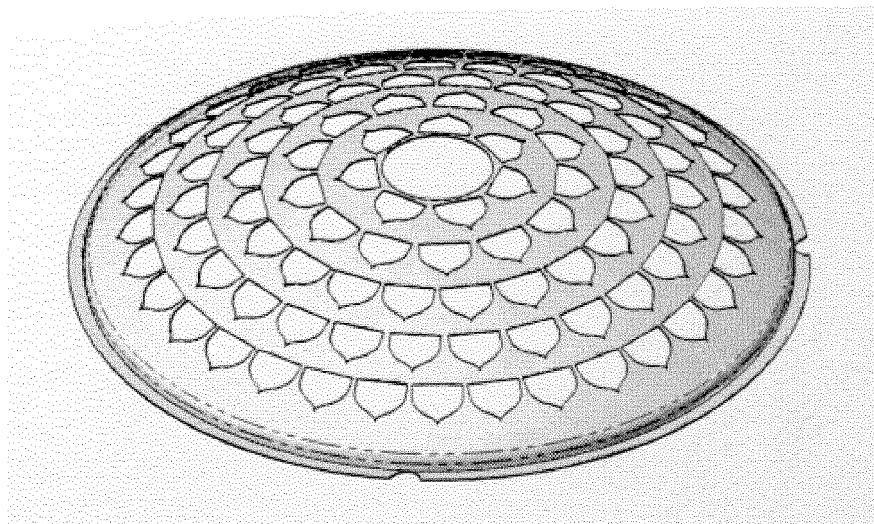

OPTICAL ARTICLE WITH GRADIENT PHOTOCHROMISM

CROSS-REFERENCE TO RELATED APPLICATIONS

This application is a national phase application under 35 U.S.C. §371 of International Application No. PCT/EP2014/070040 filed 19 Sep. 2014, which claims priority to European Patent Application No. 13306288.5 filed 20 Sep. 2013. The entire contents of each of the above-referenced disclosures is specifically incorporated by reference herein without disclaimer.

FIELD OF THE INVENTION

The present invention is drawn to an optical article comprising: (a) a photochromic substrate comprising at least one photochromic dye, and (b) an interference coating having a specific gradient thickness providing for a gradient reflectance. It also pertains to a process for making such an optical article.

BACKGROUND OF THE INVENTION

Photochromic optical articles, such as spectacle lenses, have been known for long. They include photochromic dyes which are able to darken and thus protect the eye from intense light when exposed to UV light. The wavelengths at which these photochromic dyes are activated usually range from 315 to 420 nm. Compared to conventional permanently tinted lenses, these photochromic lenses do not have the drawback of providing a low level of light transmission in a dark environment, which is prejudicial to a clear vision, and are thus better suited for driving, for instance. Among these photochromic lenses, some have a gradient profile. They are thus darker at the upper portion of the lens while having a lighter tone at the bottom, which is advantageous because they allow more light to be transmitted at the lower portion for activities involving close vision, such as reading. These gradient photochromic lenses are also considered fashionably appealing by many.

In order to obtain such gradient lenses, several methods have been proposed in the art. The method disclosed, for instance, in US 2008/0187760, consists in applying to the lens a layer of crosslinked organic polymeric matrix containing a photochromic dye in a gradient concentration.

Another method, disclosed for instance in GB-1,520,099 and U.S. Pat. No. 4,289,497, uses a uniform layer of photochromic dye coated by a non-uniform layer of UV absorbers which either has a variable thickness or contains a variable concentration of absorber. Since the UV absorber inhibits the photochromic effect, the latter is varied locally, which results in a tint gradient. The variation in the thickness of the absorbing layer may be obtained by gradual immersion of the lens in a bath containing the absorber, or by adjusting the withdrawal rate of the lens from the bath.

Another approach for producing an ophthalmic lens with spatially non-uniform photochromic properties has been disclosed in US 2012/0218512. This method comprises depositing an absorbent layer on a plastic film, which layer is able to transfer, when heated, the absorber printed therein to the film, then removing the absorbent layer by washing with a solvent to obtain a film containing an UV absorber distributed therein in a non-uniform manner, corresponding to the pattern previously printed. The film may then be affixed to a photochromic optical substrate.

These processes are not totally satisfactory.

Moreover, it would be useful to provide an optical system comprising both a gradient photochromic layer and an anti-reflection layer. This is because anti-reflection coatings have proven to be useful for providing the user with an improved contrast and an enlarged field of vision under the effects of glare. These anti-reflection coatings typically consist of a stack of dielectrics deposited under vacuum conditions. However, an anti-reflection coating is usually regarded as incompatible with a photochromic coating, since conventional anti-reflection coatings reject a significant part of UV light, hence inhibiting photochromic effects. Compromises have been developed so as to provide anti-reflection lenses with high transparency under low UV conditions and simultaneously photochromism under high UV conditions (see for instance U.S. Pat. No. 7,633,681 and U.S. Pat. No. 6,175,450). However, these compromises yield lenses tinted in a uniform manner, which thus do not provide any gradient of photochromic effect, and which are sometimes not totally clear in the absence of UV light.

U.S. Pat. No. 6,674,587 teaches a way to deposit a graded absorbing film upon a plastic substrate under vacuum by using a mask on the evaporation source. The absorbing material absorbs radiation in the UV and IR regions of the spectrum. The absorbing film is then coated with an anti-reflection coating to obtain an antiglare optical article. The method disclosed in this document is not applicable to optical articles such as ophthalmic lenses because it requires too many steps to be used industrially. Moreover, the optical article thus obtained would be exposed to a risk of delamination, which is not acceptable.

The inventors have now found that an optical article having a gradient photochromic effect and possibly a high transparency in the visible range, while exhibiting anti-reflective properties, could be obtained by conventional vacuum technology in a few steps, on an industrial scale, by means of a process which does not use UV absorbers but a specific interference coating design which reflects the wavelengths in the UV range so as to provide a gradient photochromic tint. This process may be conducted with conventional mass-production equipment.

SUMMARY OF THE INVENTION

The present invention is drawn to an optical article comprising:

(a) a photochromic substrate having two opposite sides and comprising at least one photochromic dye, wherein said photochromic substrate has a first surface portion and a second surface portion which are located on opposite ends of the same side of said photochromic substrate, (b) an interference coating having a gradient thickness, such that its thickness decreases from a highest thickness region located on said first surface portion to a lowest thickness region located on said second surface portion, wherein the difference between the mean reflectance factor of the highest thickness portion and the mean reflectance factor of the lowest thickness portion, in the wavelength range of from 330 to 380 nm, ranges from 15 to 80% and preferably from 20% to 60%.

Preferably, the lowest thickness ranges from 80% to 90% of the highest thickness. More preferably, it ranges from 85% to 90% of the highest thickness.

Preferably the interference coating also has throughout its surface a mean reflectance factor, in the wavelength range of from 400 to 700 nm, which is less than 3% and preferably less than 2%.

The invention also pertains to a process for manufacturing an optical article, comprising the successive steps of:
- providing a photochromic substrate comprising at least one photochromic dye,
- placing said substrate in a vacuum deposition chamber equipped with an evaporation device fed with a source material, wherein said evaporation device produces vapor from said source material and orient vapor towards the substrate on which vapor condenses,
- interposing a mask between said evaporation device and said substrate, on the travel of said vapor, wherein the mask intercepts non uniformly a fraction of vapour to create a gradient thickness of the vapor condensed on said substrate,
- operating said vacuum deposition chamber until the required gradient thickness is reached.

It has been demonstrated that the specific interference coating of this invention allows inhibiting photochromism in a graded fashion while providing for anti-reflection properties in the visible range of the spectrum.

Moreover, the above process uses conventional vacuum technology with masks and is thus industrially applicable and commercially viable.

DETAILED DESCRIPTION

Definitions

In this description, the term "gradient thickness" refers to a thickness which is greater at one selected end portion of the interference coating than the opposite end portion of the interference coating, with the thickness changing therebetween in a gradient manner. Generally, when the optical article is an ophthalmic lens, the thickness changes from the lower portion of the lens to the upper portion thereof, as viewed toward the face of the lens, i.e. along a vertical axis. The thicknesses of all the layers of the interference coating may change in the same proportions, i.e. in a homothetic manner. Moreover, the decrease in thickness from the highest thickness region to the lowest thickness region may be linear or not and may be continuous or not.

The "mean reflectance factor", or Rm, is as defined in the ISO Standard 13666:1998 and may be measured according to the ISO Standard 8980-4 (at an incidence angle of between 0° and 17° and typically of 15°). It corresponds in this invention to the average of spectral reflectance over the range of wavelengths from 330 to 380 nm, expressed as a percentage. A "difference in the mean reflectance factor" is thus also expressed as a percentage, in absolute value.

As used herein, a "(co)polymer" is intended to mean a copolymer or a polymer. Moreover, (meth)acrylic and (meth)acrylate are respectively intended to mean acrylic or methacrylic and acrylate or methacrylate.

The optical article of this invention is preferably an ophthalmic lens which may be a corrective or non-corrective lens and could be selected for example from a semi-finished lens, a finished lens, a progressive lens, an afocal lens, a plano lens, a unifocal lens, and a multifocal lens.

It includes a photochromic substrate. The expression "photochromic substrate" covers both a transparent optical substrate coated on at least one of its surfaces with a photochomic layer and a transparent optical substrate containing photochromic dyes. By "photochromic dye" it is intended to mean a compound which, when activated by UV-A light at any wavelength between 315 and 420 nm, is able to darken to such an extent that the visible light transmission factor decreases by at least 15%. The photochromic dyes used in accordance with this invention may be organic compounds. Examples of photochromic dyes may be selected from the group consisting of: chromenes, oxazine derivatives such as spiroxazines, naphotpyranes, spiropyranes, fulgides, fulgimides, organometallic derivatives of dithizonate, and their mixtures. Examples of chromenes are disclosed in U.S. Pat. No. 3,567,605, U.S. Pat. No. 5,066,818, WO-93/17071, WO-94/20869, FR 2 688 782, FR-2 718 447, EP-0 401 958 and EP-0 562 915. Examples of spiroxazines are described in U.S. Pat. No. 5,114,621, EP-0 245 020, JP-A-03-251 587, WO-96/04590 and FR-2 763 070. Examples of naphtopyranes are disclosed in U.S. Pat. No. 5,066,818, WO 93/17071, and FR-A-2 688 782. A mixture of several photochromic dyes may be used, which have different activation wavelengths.

The photochromic substrate may also include conventional dyes and/or pigments.

The photochromic substrate may be obtained according to different methods. A first method involves heating an optical substrate coated with a film containing photochromic dyes so as to transfer the dyes into the substrate (see for instance U.S. Pat. No. 4,286,957 and U.S. Pat. No. 4,880,667). A second method is the "cast-in place" process, in which photochromic dyes are mixed with the monomers used for forming the optical substrate, before they are cast in a mould and polymerized therein. A third method comprises applying the photochromic dyes to the optical substrate either by spin coating so as to form a film containing the photochromic dyes on the substrate, or by dipping the substrate into a bath comprising said dyes so as to impregnate the substrate with said dyes. Preferred photochromic substrates are Transitions® lenses from Transitions Optical, especially Transitions® Signature™ VI or Transitions® Signature™ VII The optical substrate may be any transparent glass or organic material. The organic substrate may comprise thermoset or thermoplastic materials. Amongst the materials suitable for the substrate are to be mentioned polycarbonate, polyamide, polyimide, polysulfone, copolymers of poly (ethylene terephtalate) and polycarbonate, polyolefines, notably polynorbornene, homopolymers and copolymers of diethyleneglycol bis(allylcarbonate), homopolymers and copolymers of allyl esters which may be derived from Bisphenol A or phtalic acids and allyl aromatics such as styrene, (meth)acrylic polymers and copolymers, notably polymers and copolymers of (meth)acrylic derivatives with bisphenol-A, thio(meth)acrylic polymers and copolymers, polyurethane and polythiourethane homopolymers and copolymers, epoxy polymers and copolymers and episulfide polymers and copolymers. Preferred substrates according to this invention comprise those based on polycarbonate or on (co)polymers of diethyleneglycol bis(allylcarbonate) such as that sold under the trade name CR-39® by PPG Industries (ORMA® lenses from ESSILOR) or (meth)acrylic copolymers having a refractive index between 1.54 and 1.58.

According to this invention, the interference coating applied onto the photochromic substrate has a gradient thickness with a highest thickness region located on a first surface portion of the substrate and a lowest thickness region located on a second surface portion of the substrate, wherein the difference between the mean reflectance factor of the highest thickness portion and the mean reflectance factor of the lowest thickness portion, in the wavelength range of 330-380 nm, ranges from 15 to 80%.

The interference coating usually comprises from 2 to 12 layers, preferably from 4 to 8 layers. These layers generally comprise at least one layer, preferably at least two layers, with a low refraction index (or LI layer) and at least one layer, preferably at least two layers, with a high refraction index (or HI layer). A HI layer has a refraction index of more than 1.6, for instance more than 1.65 or even more than 1.7 or more than 1.8, while a LI layer has a refraction index of at most 1.6, for instance less than 1.5 or even less than 1.48, when measured at 25° C. at a wavelength of 550 nm. The HI and LI layers are not necessarily arranged alternately, although they may be in a preferred embodiment of this invention. The total thickness of the interference coating may range between 150 and 600 nm, preferably between 250 and 600 nm.

Examples of LI layers are those comprising, and preferably consisting of, at least one oxide chosen from $SiO_2$ optionally mixed with at most 20%, preferably at most 10% and more preferably at most 5% of $Al_2O_3$. They may have an individual thickness ranging from 10 to 100 nm, preferably from 20 to 80 nm and more preferably from 30 to 75 nm. Examples of HI layers are those comprising, and preferably consisting of, at least one oxide chosen from: $ZrO_2$, $TiO_2$, $Al_2O_3$, $Ta_2O_5$, $Nd_2O_5$, $Pr_2O_3$, $PrTiO_3$, $La_2O_3$, $Nb_2O_5$, $Y_2O_3$ and their mixtures, optionally mixed with $SiO_2$. Preferred materials are $TiO_2$, $PrTiO_3$, $ZrO_2$, $Al_2O_3$, $Y_2O_3$ and their mixtures. They may have an individual thickness ranging from 10 to 100 nm, preferably from 15 to 80 nm and more preferably from 20 to 70 nm.

The interference coating may also include at least one antistatic layer which is generally interposed between two HI and/or LI layers, and which comprises, or consists in, a conductive metallic oxide selected from tin oxide, indium oxide, indium-doped tin oxide (ITO) and their mixtures. This layer may have a thickness from 5 to 15 nm.

Alternatively or in addition to the antistatic layer, the interference coating may comprise an adhesion layer, which may be the layer of this coating which is the closest to the substrate. This adhesion layer preferably comprises at least 80%, or even consists, of silica, which generally has a thickness ranging from 100 to 150 nm.

In this invention, the interference coating is applied to the photochromic substrate by vacuum evaporation. According to this method, the photochromic substrate is placed in a vacuum deposition chamber equipped with an evaporation device fed with a source material. The evaporation device is adapted for producing vapor from said source material and is positioned such that the vapor is ejected from the evaporation device to the substrate, on which vapor condenses. Preferably, the materials of the interference coating are heated at a temperature between 1000 and 2200° C., usually by an electric heating element (i.e. by Joule effect) or otherwise by electron beam, for instance by a tungsten spiral filament or by any other device well known by the skilled artisan. Usually, the surface of the substrate is cleaned before deposition of the successive layers of the interference coating, for instance by ultrasonic treatment in a solvent, which may be followed by a finishing step in the vacuum deposition chamber. This finishing step may be conducted by ion pre-cleaning or by ion spallation.

In order to obtain a gradient thickness of the interference coating, a mask is interposed between the evaporation device of the vacuum chamber and the photochromic substrate, on the travel of the vapor ejected from the source material, i.e. the metallic oxides used to form the interference coating. Two kinds of masks may be used to implement this process. The first kind of mask comprises mask films directly attached to the lenses located in the vacuum chamber. Another kind of mask called "contoured rotating mask" is designed to intercept vapour in a non uniform manner along a radial axis thereof, in the vacuum chamber. The mask is placed in front of lenses disposed on a rotating carousel. The ratio of the length of the mask to the length of the revolution circle of the mask defines an occultation factor. The larger the occultation factor, the more vapour is intercepted, the thinner the deposit. Such masks may be in the form of a carousel provided with holes having a specific design, or in the form of an anchor or any other blade having a shape designed to shield deposition of the vapor onto the substrate. These masks are adapted to be fixed in the chamber or for rotating in the chamber at a rate that differs from the rotating rate of the carousel. The relative rotation rate and design of the mask can be easily adjusted by the skilled person to obtain the required gradient thickness along the radius of the carousel. The thickness of the layer thus deposited can be monitored by means of a micro-balance, as is well known by the skilled artisan.

Therefore, the thickness of the antireflection coating may vary in any manner from the highest thickness region to the lowest thickness region. Thickness variation may be monotonous.

Preferably, the thickness of the antireflection coating varies along an axis which is vertical in normal conditions of use of the optical article, i.e., in the case of an ophthalmic lens, when the viewer is in the upright position.

In addition to the photochromic substrate and interference coating, the optical article of this invention may include at least one coating selected from: a primer or impact-resistant coating, an anti-abrasion or scratch-resistant coating, an anti-fog topcoat, and an anti-fouling topcoat, for instance. The primer is usually in direct contact with the photochromic substrate. Moreover, the abrasion-resistant coating may be interposed between the photochromic substrate and the interference coating or between the primer and the interference coating. Alternatively, the abrasion-resistant coating may be coated directly onto the optical substrate and constitute the photochromic layer. The topcoats may be applied onto the interference coating of this invention.

The impact-resistant coating can be any coating typically used for improving impact resistance of a finished optical article. Also, this coating generally enhances adhesion of the scratch-resistant coating on the substrate of the finished optical article. Typical impact-resistance coatings are (meth) acrylic based coatings and polyurethane-based coatings. (Meth)acrylic-based impact-resistant coatings are, among others, disclosed in U.S. Pat. Nos. 5,015,523 and 6,503,631. The impact-resistant coating composition can be applied onto the optical substrate using any classical method such as spin, dip, or flow coating. A method for applying the impact-resistant composition onto the substrate is given for instance in Example 1 of U.S. Pat. No. 5,316,791. Thickness of the impact-resistant coating, after curing, typically ranges from 0.05 to 30 μm, preferably 0.5 to 20 μm and more particularly from 0.6 to 15 μm, and even better 0.6 to 5 μm.

The abrasion- and/or scratch-resistant coating composition can be a UV and/or a thermal curable composition.

Typical abrasion-resistant coatings are those obtained by curing a solution prepared by a sol-gel process from at least one alkoxyalkylepoxysilane such as γ-glycidoxypropyl trimethoxysilane, γ-glycidoxypropyltriethoxysilane or γ-glycidoxypropyl methyldiethoxysilane, among which γ-glycidoxypropyl trimethoxysilane (GLYMO) and/or γ-glycidoxypropyl methyldiethoxysilane (Methyl GLYMO) are preferred. The alkoxyalkylepoxysilane may be combined with at least one alkoxysilane which does not contain any reactive functional group but optionally contains at least one non-hydrolyzable organic group, such as dimethyldimethoxysilane, dimethyldiethoxysilane (DMDES), methylphenyldimethoxysilane or tetraethylorthosilicate (TEOS). The epoxysilane and the above alkoxysilane, if present, are usually hydrolyzed so as to produce the abrasion-resistant coating, using known sol-gel processes. The techniques described in U.S. Pat. No. 4,211,823 can be employed. The alkoxyalkylepoxysilane may also be combined with a colloidal inorganic binder, which may be chosen from metal oxides or preferably colloidal silica, i.e. fine particles of silica with a diameter of preferably less than 50 nm, for instance between 5 and 40 nm, in dispersion in a solvent, preferably an alcohol type solvent or alternatively water. An example of such colloidal silica is Nissan Sun Colloid Mast® which contains 30% of solid $SiO_2$ in suspension in methanol, or Eka Chemicals' Nyacol® 2034 DI.

Moreover, the mixture used to prepare the abrasion-resistant coating can comprise a catalyst such as an aluminium chelate and/or other organic solvents, preferably alcohol type solvents such as methanol, which serve to adjust the viscosity of the composition. Photopolymerization initiators may be included into UV curable compositions. Furthermore, this mixture can also include various additives, such as surfactants or wetting agents to improve spreading of the composition over the surface to be coated, dye agents and/or pigments. Specific examples of mixtures used to prepare the abrasion-resistant coating may be found in US 2005/0123771.

The abrasion-resistant coating may be applied to the underlying coating by any means known to the skilled artisan, for instance dip-coating, bar coating, spray coating, or spin coating. Its thickness generally ranges from 1 to 10 μm, for instance from 3 to 5 μm.

The anti-fouling top coats used in this invention are those which reduce surface energy of the optical article preferably to less than 14 $mJ/m^2$. The invention has a particular interest when using anti-fouling topcoats having a surface energy of less than 13 $mJ/m^2$ and even better less than 12 $mJ/m^2$. These surface energy values are calculated according to Owens Wendt method described in the following document: Owens, D. K.; Wendt, R. G. "Estimation of the surface force energy of polymers", J. Appl. Polym. Sci. 1969, 51, 1741-1747.

The anti-fouling top coat according to the invention is preferably of organic nature, such as compounds widely disclosed in the previous art, for example in U.S. Pat. No. 4,410,563, EP 0 203 730, EP 0 749 021, EP 0 844 265, EP 0 933 377 and U.S. Pat. No. 6,277,485.

Commercial compositions for making anti-fouling top coats are the compositions KY130 and KP 801 M commercialized by Shin-Etsu Chemical and the composition OPTOOL DSX (a fluorine-based resin comprising perfluoropropylene moieties) commercialized by Daikin Industries. OPTOOL DSX is the most preferred coating material for anti-fouling top coats.

The anti-fog topcoat usually consists in a hydrophilic coating, which provides a low static contact angle with water, preferably of less than 50°, more preferably of less than 25°. Such coatings are for example described in EP 1 324 078, U.S. Pat. No. 6,251,523, U.S. Pat. No. 6,379,776, EP 1275624 and WO 2011/080472.

DRAWINGS

The attached FIGURE illustrates a mask that may be used to implement the process of this invention.

This invention will be better understood in light of the following examples which are given for illustration purposes only and do not intend to restrict in any way the scope of the appended claims.

EXAMPLES

Example 1

Manufacture of an Ophthalmic Lens

Interference coatings consisting of the following layers are deposited by vacuum evaporation onto photochromic substrates sold as ORMA® Transitions VI grey which are coated with an anti-abrasion coating as described in Example 3 of EP-0 614 957. The first ZrO2 layer in the table below is deposited directly onto the anti-abrasion coating. The evaporation device and the conditions of deposition of the layers are as described in WO 2008/107325, except that a mask is used so as to obtain a gradient thickness as indicated in the table below.

The mask used is a "contoured rotating mask", as shown on the attached FIGURE.

This mask looks like the carousel on which optical substrates to be coated are laid. The shape of apertures defines an occultation factor. In order to obtain the thickness variation mentioned in the Table below, an aperture of maximal width W0 is defined. This maximal aperture is located on the circle which is in front of the upper part of the optical substrate to be coated. In front of the lower part of the optical substrate, the aperture width is smaller: W1. The variation of width from W0 to W1 along a radius is linear, but could have any shape. For convenience in realization, there is an aperture for each optical substrate.

In example 1, the ratio between W0 and W1 is W1/W0=80/90, so that the highest thickness represents 90% of the nominal thickness and the lowest thickness is 80% of the nominal thickness. In examples 2 to 4, the ratio between W0 and W1 is adjusted according to the targeted thicknesses.

|  | Ex. 1 | Nominal thickness | Ex. 2 | Nominal thickness | Ex. 3 | Nominal thickness | Ex. 4 | Nominal thickness |
|---|---|---|---|---|---|---|---|---|
| $1^{st}$ layer | $ZrO_2$ | 20 nm | $ZrO_2$ | 44 nm | $ZrO_2$ | 47 nm | $ZrO_2$ | 47 nm |
| $2^{nd}$ layer | $SiO_2$ | 75 nm | $SiO_2$ | 45 nm | $SiO_2$ | 50 nm | $SiO_2$ | 50 nm |
| $3^{rd}$ layer | $ZrO_2$ | 50 nm | $ZrO_2$ | 68 nm | $ZrO_2$ | 54 nm | $ZrO_2$ | 54 nm |
| $4^{th}$ layer | $SiO_2$ | 35 nm | $SiO_2$ | 32 nm | $SiO_2$ | 70 nm | $SiO_2$ | 70 nm |
| $5^{th}$ layer | $ZrO_2$ | 68 nm | $ZrO_2$ | 66 nm | $ZrO_2$ | 45 nm | $ZrO_2$ | 45 nm |
| $6^{th}$ layer | $SiO_2$ | 117 nm | $SiO_2$ | 124 nm | $SiO_2$ | 62 nm | $SiO_2$ | 62 nm |
| $7^{th}$ layer |  |  |  |  | $ZrO_2$ | 53 nm | $ZrO_2$ | 53 nm |
| $8^{th}$ layer |  |  |  |  | $SiO_2$ | 132 nm | $SiO_2$ | 132 nm |
| Nominal Thickness |  | 365 nm |  | 379 nm |  | 513 nm |  | 513 nm |

-continued

|  |  | Ex. 1 | Nominal thickness | Ex. 2 | Nominal thickness | Ex. 3 | Nominal thickness | Ex. 4 | Nominal thickness |
|---|---|---|---|---|---|---|---|---|---|
| Highest thickness region | Thickness | | 328 nm—90% of nominal | | 318 nm—84% of nominal | | 410 nm—80% of nominal | | 462 nm—90% of nominal |
|  | Rm (%) [330 nm-380 nm] | | 50% | | 47% | | 54% | | 79% |
| Lowest thickness region | Thickness | | 80% of nominal | | 74% of nominal | | 70% of nominal | | 80% of nominal |
|  | Rm (%) [330 nm-380 nm] | | 24% | | 13% | | 7% | | 54% |

The invention claimed is:

1. An optical article comprising:
   (a) a photochromic substrate having two opposite sides and comprising at least one photochromic dye, wherein said photochromic substrate has a first surface portion and a second surface portion which are located on opposite ends of the same side of said photochromic substrate,
   (b) an interference coating having a gradient thickness, such that its thickness decreases from a highest thickness region located on said first surface portion to a lowest thickness region located on said second surface portion, wherein the difference between the mean reflectance factor of the highest thickness portion and the mean reflectance factor of the lowest thickness portion, in the wavelength range of from 330 to 380 nm, ranges from 15 to 80%.

2. The optical article according to claim 1, wherein the lowest thickness ranges from 80% to 90% of the highest thickness.

3. The optical article according to claim 1, which is an ophthalmic lens.

4. The optical article according to claim 1, wherein the photochromic substrate is based on polycarbonate, or on a (co)polymer of diethyleneglycol bis(allylcarbonate) or on (meth)acrylic copolymers having a refractive index between 1.54 and 1.58.

5. The optical article according to claim 1, wherein the interference coating comprises from 4 to 8 layers, comprising at least two layers with a low refractive index and at least two layers with a high refractive index which are arranged alternately.

6. The optical article according to claim 1, wherein the optical article further includes at least one coating selected from: a primer, an anti-abrasion coating, an antistatic layer, an anti-fog topcoat and an anti-fouling topcoat.

7. The optical article according to claim 1, wherein the interference coating has throughout its surface a mean reflectance factor, in the wavelength range of from 400 to 700 nm, which is less than 3% and preferably less than 2%.

8. The optical article according to claim 1, wherein the thickness of the antireflection coating varies, preferably monotonously, from the highest thickness region to the lowest thickness region, along an axis which is vertical in normal conditions of use of the optical article.

9. Spectacles comprising at least one ophthalmic lens comprising:
   (a) a photochromic substrate having two opposite sides and comprising at least one photochromic dye, wherein said photochromic substrate has a first surface portion and a second surface portion which are located on opposite ends of the same side of said photochromic substrate,
   (b) an interference coating having a gradient thickness, such that its thickness decreases from a highest thickness region located on said first surface portion to a lowest thickness region located on said second surface portion, wherein the difference between the mean reflectance factor of the highest thickness portion and the mean reflectance factor of the lowest thickness portion, in the wavelength range of from 330 to 380 nm, ranges from 15 to 80%.

* * * * *